United States Patent [19]

Saga et al.

[11] Patent Number: 5,330,584
[45] Date of Patent: Jul. 19, 1994

[54] SOLAR CELL

[75] Inventors: Tatsuo Saga; Tadashi Hisamatsu; Toshinobu Matsutani, all of Nara, Japan

[73] Assignee: Sharp Kabushiki Kaisha, Osaka, Japan

[21] Appl. No.: 959,908

[22] Filed: Oct. 13, 1992

[30] Foreign Application Priority Data

Oct. 17, 1991 [JP] Japan .................................. 3-269568

[51] Int. Cl.⁵ .............................................. H01L 31/06
[52] U.S. Cl. ............................................... 136/255
[58] Field of Search .................................... 136/255

[56] References Cited

U.S. PATENT DOCUMENTS 4,004,949 1/1977 Lesk ........................................ 437/2
4,112,457 9/1978 D'Aiello ............................... 136/255
4,116,717 9/1978 Rahilly ................................ 136/255

FOREIGN PATENT DOCUMENTS 2-201972 8/1990 Japan ................................... 136/255
3-24768 2/1991 Japan ................................... 136/255
3-120762 5/1991 Japan ................................... 136/255

OTHER PUBLICATIONS

Patent Abstracts Japan vol. 7, No. 204, (E-197) 1349 Sep. 9, 1993, 58-101471 (Yamaguchi).
*14th IEEE Photovoltaic Specialists Conf.* (1980) Jan. 7-10, 1980 "Compatibility of BSR and BSF solar cell Technology".
*Solar Cells,* vol. 19, No. 1, Nov. 1986, pp. 97-108, Green et al.

*Primary Examiner*—Aaron Weisstuch
*Attorney, Agent, or Firm*—Nixon & Vanderhye

[57] ABSTRACT

A solar cell includes a first semiconductor region of a P type, a second semiconductor region of an N type in contact with the first semiconductor region so as to form a PN junction therebetween, and a third semiconductor region of a P+ type in contact with both the first and second semiconductor regions and having a higher impurity concentration than that of the first semiconductor region.

17 Claims, 11 Drawing Sheets $V_{10} + V_{11} = V_B$ $V_{10} = V_B - V_{11}$

SOLAR CELL

BACKGROUND OF THE INVENTION

1. Field of the Invention

The present invention relates generally to solar cells and, more particularly, to a solar cell which enables prevention of an accident caused by a reverse bias voltage generated, for example, when a solar cell module is shaded.

2. Description of the Prior Art

FIG. 12 is a top plan view showing a typical example of a solar cell of the prior art; FIG. 13 is a cross-sectional view taken along the line 13—13' of FIG. 12; and FIG. 14 is a bottom view of the solar cell of FIG. 12. As can be seen in FIGS. 12, 13, and 14, a light receiving surface of the solar cell is coated with a transparent anti-reflection film 8. Comb tooth or grid-like from electrodes 7 are provided beneath the anti-reflection film 8. One end of each of the from electrodes 7 is connected to an electrode connecting portion 5 which is a so-called bus bar or contact electrode. Further, the solar cell includes a P type region 1 occupying a large part of a silicon substrate, an N type region 2 formed on an upper side surface of the P type region 1, and a P+ region 3 for a BSF (back surface field) effect, foraged on a lower side surface of the P type region 1. A back electrode 6 is provided to cover approximately the entire lower side surface of the P+ region 3.

The solar cell of FIG. 13 can be manufactured, for example, by the following process:

First, a P type silicon substrate 1 shown in FIG. 15A is prepared.

With reference to FIG. 15B, a P+ region 3 is formed by diffusion into the overall surface area of the P type silicon substrate 1 of FIG. 15A.

Referring to FIG. 15C, the P+ region 3 on the upper surface of the silicon substrate 1 is then removed by etching.

After that, an N type region 2 is formed on the upper surface of the P type silicon substrate 1 as shown in FIG. 15D.

With reference to FIG. 15E, comb tooth-like front electrodes 7 (not shown) and an electrode connecting portion 5 are formed on the N type region 2. At least the N type region 2 is coated with an anti-reflection film 8. A back electrode 6 is provided on the lower surface of the P+ region 3. With the resultant structure cut along the broken lines indicated on opposite sides of FIG. 15E, the solar cell shown in FIG. 13 is obtained.

It is rare that the solar cell shown in FIG. 12 is used alone. Normally, in order to obtain a desired output voltage and current, a solar cell module M in which a plurality of solar cells are connected in series and in parallel is formed, as shown in FIG. 16A.

When the solar cell module M is in practical use, a part of the module M is sometimes shaded. In the case with a solar cell module M for use in space, it is possible that the shadow of a part of a main body of a satellite or the shadow of a structure such as an antenna is cast on the solar cell module M during, for example, attitude control of the satellite. Further, in the case with a solar cell module M for terrestrial use, it sometimes happens that the shadows of trees or buildings are cast on the solar cell module M and that droppings of birds obscure part(s) of the solar cell module M.

Referring to FIGS. 16A and 16B, solar cell module M in which some of the solar cells are shaded is illustrated. That is, a shadow is cast on a submodule 10 including a plurality of solar cells arranged in parallel. With reference to FIG. 16A, a voltage $V_{11}$ generated from another submodule 11 which unshaded is applied as a reverse bias voltage to the shaded submodule 10 in a shunt mode in which the opposite ends of the solar cell module M are almost short-circuited. A relation $V_{10} = -V_{11}$ is satisfied where the voltage of the submodule 10 is $V_{10}$. When the solar cell module M is connected with an external power supply $V_B$, a relation $V_{10} = V_B - V_{11}$ is satisfied as shown in FIG. 16B.

That is to say, when a positive voltage is applied to the front electrodes of the shaded submodule 10 of the solar cell module M and the reverse bias voltage of the applied positive voltage exceeds the reverse breakdown voltage of the solar cell, the solar cells in the submodule 10 incur short-circuit damage, thereby deteriorating the output characteristics of the entire solar battery module M.

In order to prevent such an accident caused by the reverse bias voltage in the solar battery module M, a bypass diode is typically connected for each solar cell or each submodule including a certain number of solar cells. In addition, so-called diode integrated solar cells are employed in which the bypass diodes are integrated with the solar cells themselves.

The method of connecting the bypass diodes has problems such that the manufacturing cost of the solar cell module increases in proportion to the number of bypass diodes to be used and the light receiving area on the solar cell decreases in proportion to the area necessary for connection of the bypass diodes.

In addition, in the diode integrated solar cell, since both the diodes and the solar cells must be integrated in the same silicon substrate, its manufacturing method becomes complicated. That is, the manufacturing cost of the diode integrated solar cell becomes higher as compared to that of a normal solar cell.

SUMMARY OF THE INVENTION

In view of the foregoing prior art, an object of the present invention is to provide a solar cell at a low cost in which short-circuit damage caused by a reverse bias voltage can be prevented.

A solar cell in accordance with the present invention includes a first semiconductor region of a P type, a second semiconductor region of an N type in contact with the first semiconductor region to form a PN junction therebetween, and a third semiconductor region of a P type in contact with both the first semiconductor region and the second semiconductor region and having an impurity concentration higher than that of the first semiconductor region.

When a reverse bias voltage is applied to the solar cell of the present invention, the PN junction between the first and second semiconductor regions and a P+N junction between the second and third semiconductor regions are reverse-biased. At that time, a breakdown due to a Zener effect is more liable to occur in the P+N junction between the second and third semiconductor regions as compared to the PN junction between the first and second semiconductor regions. That is, when a relatively small reverse bias voltage is applied to the solar cell, the P+N junction between the second and third semiconductor regions causes a certain magnitude of reverse current, and if the reverse bias voltage becomes higher, a Zener breakdown takes place. This can prevent a breakdown in the PN junction between the first and second semiconductor regions, which is necessary in the solar cell.

FIG. 11 shows an equivalent circuit of the solar cell of the present invention. That is, the solar cell in accordance with the present invention includes a solar cell having a PN junction, and a diode which has a P+N junction and is connected in parallel with the PN junction. Consequently, if a reverse bias is applied to the solar cell of the present invention, then a current flows through the P+N junction having a relatively large reverse leakage, whereby the PN solar cell can be protected from a breakdown.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the above figures, identical reference characters denote corresponding portions.

DESCRIPTION OF THE PREFERRED EMBODIMENTS

Figure 1A:
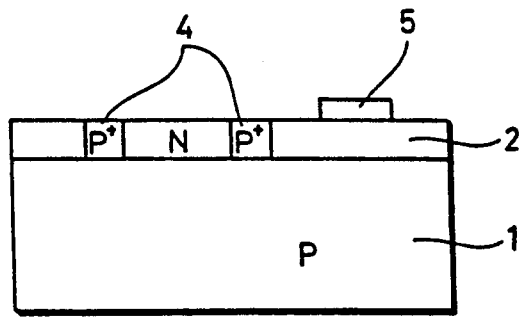
FIGS. 1A, 1B, and 1C are cross-sectional views of solar batteries of various types in accordance with the present invention.
Figure 1B:
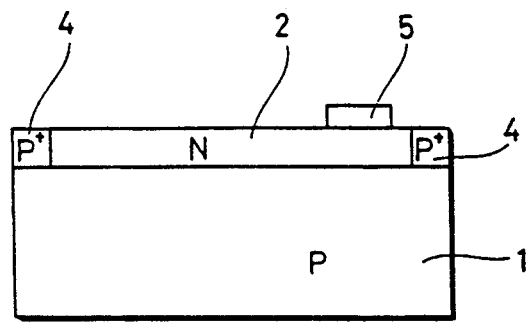
Figure 1C:
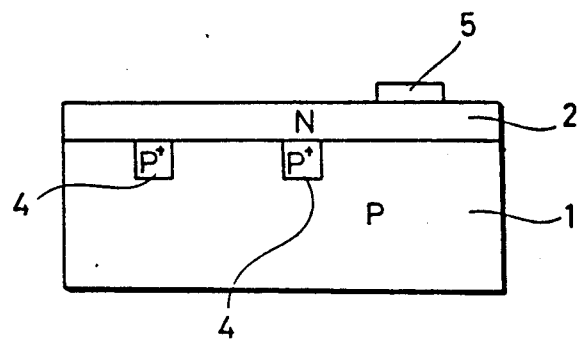

With reference to FIGS. 1A, 1B, and 1C, solar batteries of various types according to various embodiodents of the present invention are illustrated in schematic cross-sectional views. The structures of these types may be combined together.

In the solar cell of FIG. 1A, an N type semiconductor region 2 is formed on a top surface of a P type semiconductor region 1. A plurality of island-like P+ regions 4 are formed in the N type region 2. These P+ regions 4 are not in contact with the front electrode (not shown).

In the solar cell of FIG. 1B, a plurality of P+ regions 4 are formed along the periphery of an N type region 2 formed on a top surface of a P type region 1. The P+ regions 4 are not in contact with the from electrode (not shown).

In the solar cell of FIG. 1C, a plurality of well-like P+ regions 4 are formed on a top surface of a P type region 1. The P type region 1 and P+ regions 4 are covered with an N type region 2.

Figure 2:
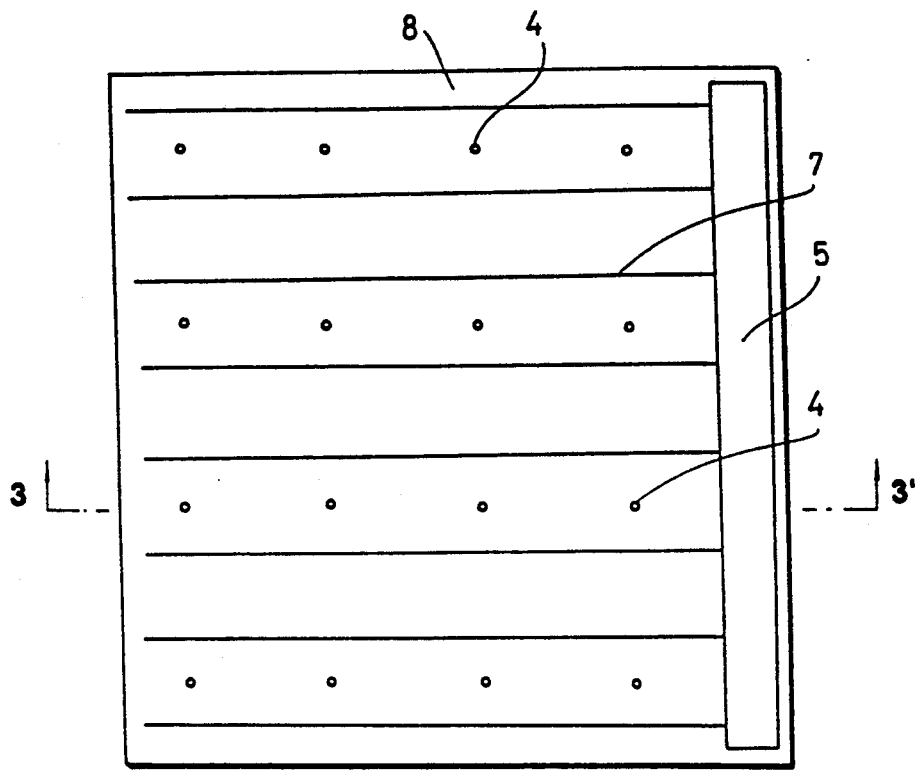
FIG. 2 is a top view of a solar cell according to one embodiodent of the present invention.
Figure 3:
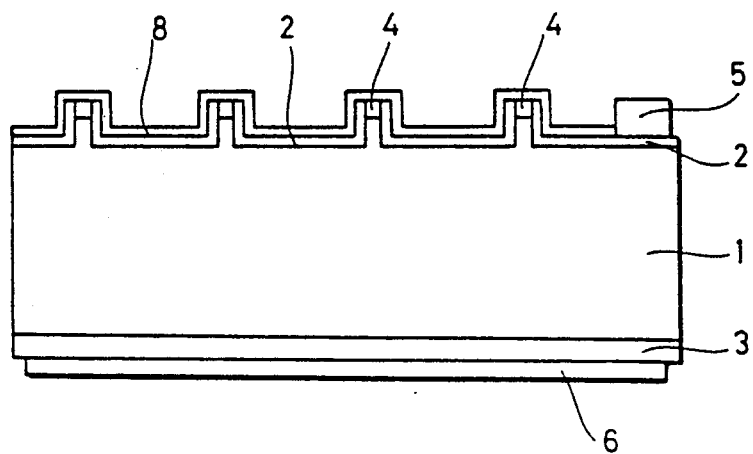
FIG. 3 is a cross-sectional view taken along the line 3—3' of FIG. 2.
Figure 12:
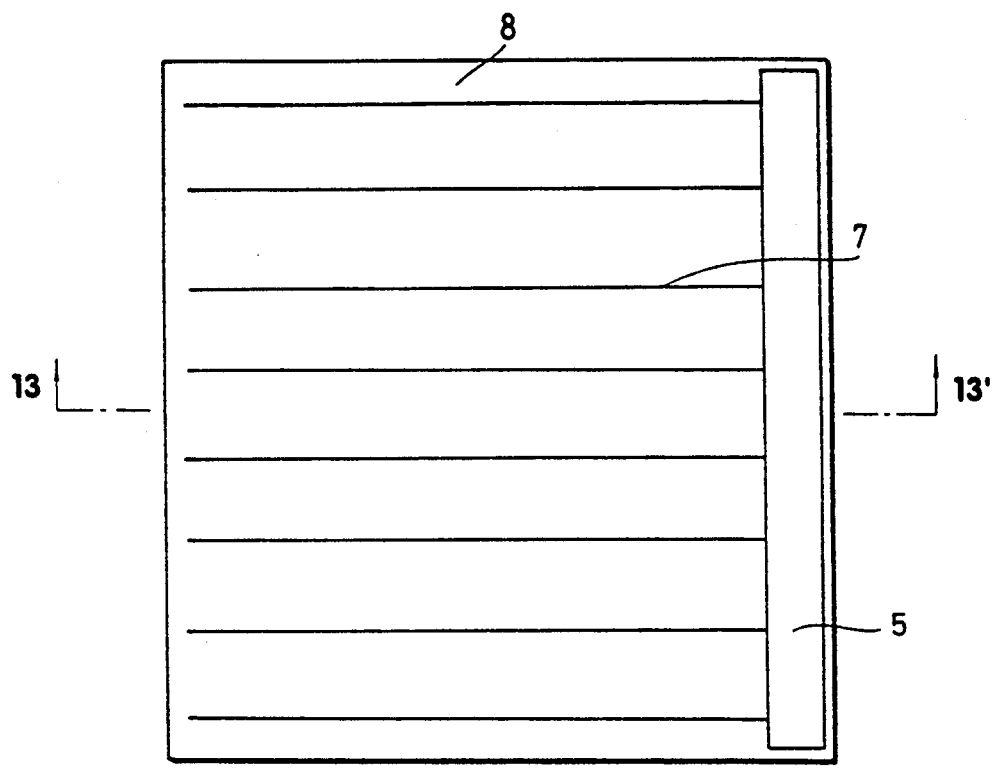
FIG. 12 is a top view of a prior art solar cell.
Figure 13:
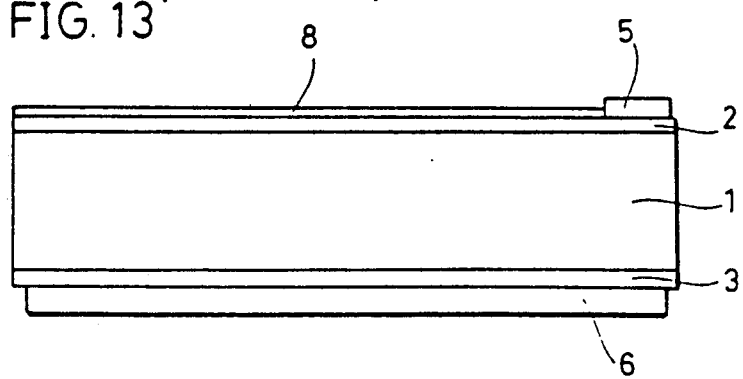
FIG. 13 is a cross-sectional view taken along the lines 12—12' of FIG. 12.
Figure 14:
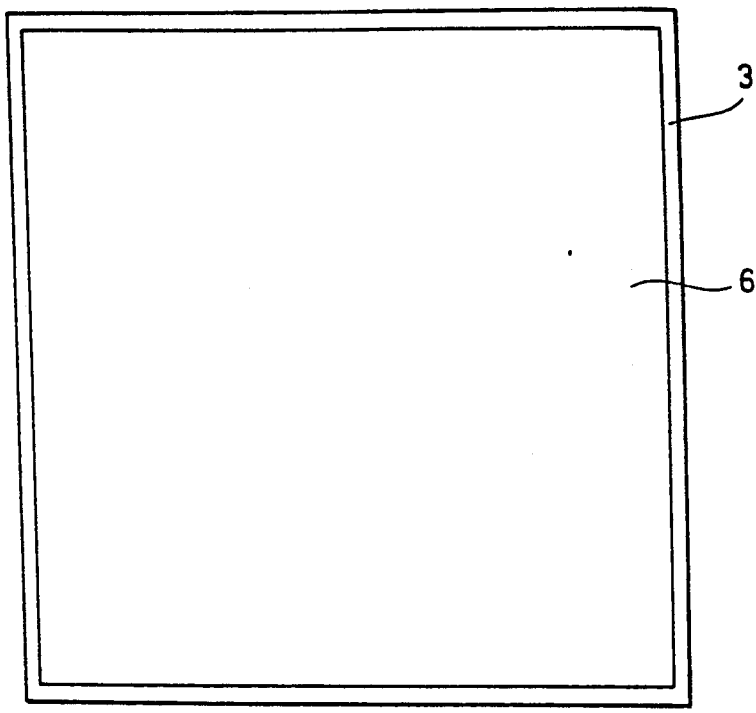
FIG. 14 is a bottom view of the solar cell of FIG. 12.
Figure 15A:
FIGS. 15A-15E are cross-sectional views showing steps of manufacturing the solar cell of FIG. 13.
Figure 15B:
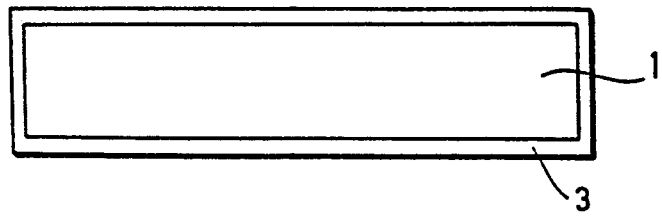
Figure 15C:
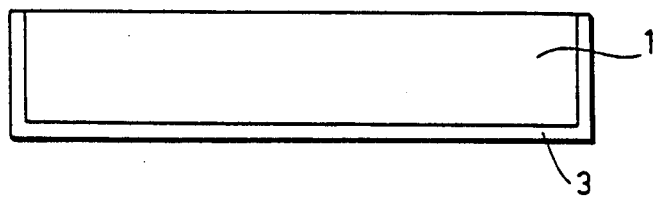
Figure 15D:
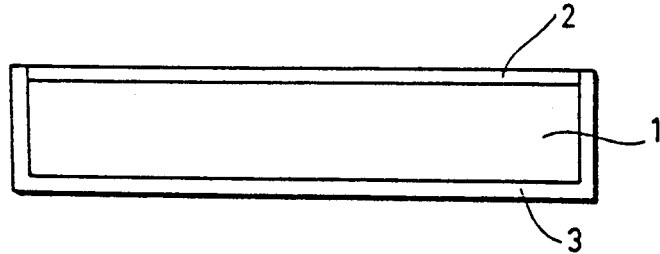
Figure 15E:
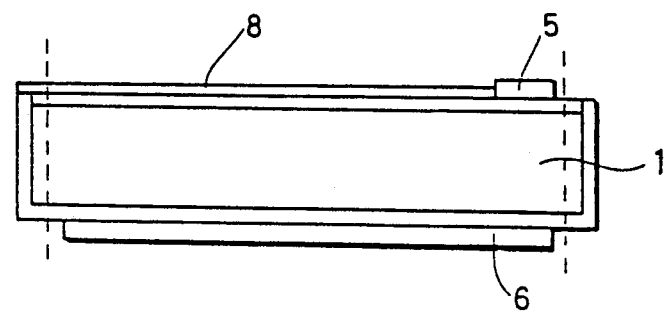
Figure 16A:
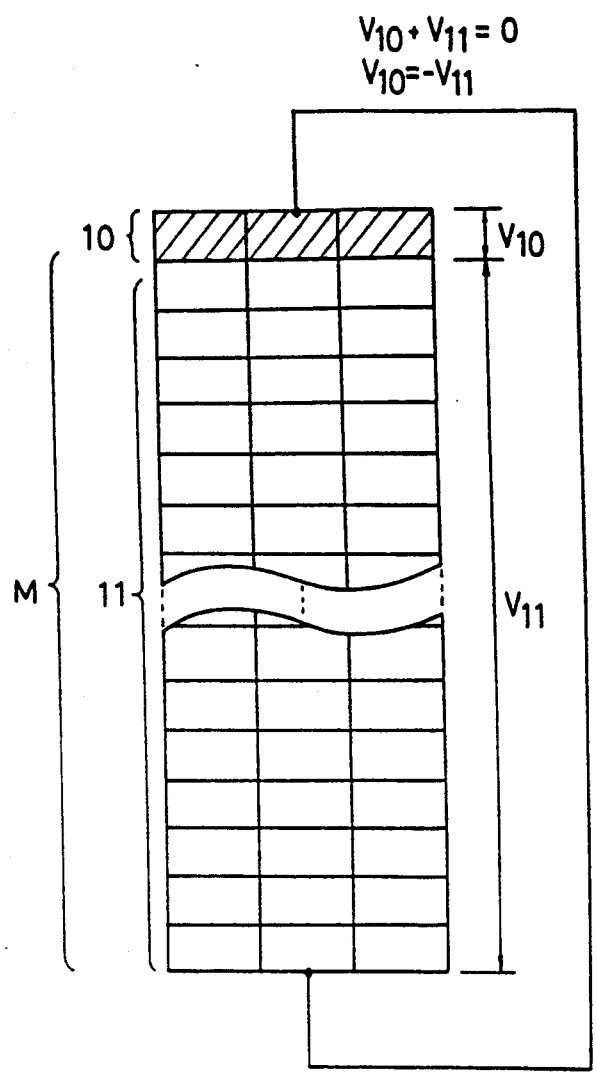
FIGS. 16A and 16B are top views showing a solar cell module.
Figure 16B:
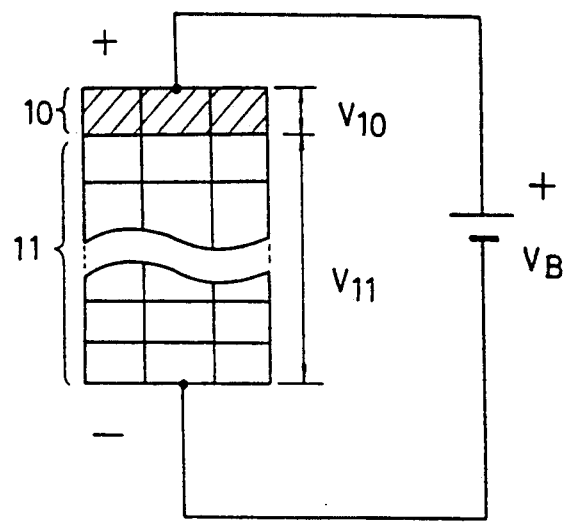

FIG. 2 is a top view of the solar cell of the FIG. 1A type; and FIG. 3 is a cross-sectional view taken along the line 3—3' of FIG. 2. The solar cell shown in FIGS. 2 and 3 includes an anti-reflection film 8, an N type region 2, a P type region 1, a P+ region 3, a back electrode 6, comb tooth-like front electrodes 7 and an electrode connecting portion 5, similarly to the solar cell shown in FIGS. 12 and 13.

The solar cell shown in FIGS. 2 and 3, however, includes in addition to the above elements, a plurality of small island-like P+ regions 4 locally formed in the N type region 2. Those island-like P+ regions 4 are formed so as not to be in contact with any of the comb tooth-like electrodes 7.

Since the island-like P+ regions 4 have a higher impurity concentration than that of the P type region 1, the P+N junctions formed between the island-like P+ regions 4 and the N type region 2 have the property that a breakdown due to a Zener effect is liable to occur. The P+ regions 4 may have an impurity concentration of not less than $1 \times 10^{18} \text{cm}^{-3}$ in order to cause the Zener effect.

The solar cell of FIG. 3 can be manufactured by, e.g., the following process.

Figure 4A:
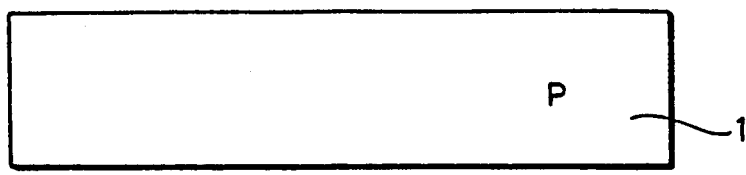
FIGS. 4A-4F are cross-sectional views showing steps of manufacturing the solar cell of FIG. 3.

First, a P type silicon substrate 1 shown in FIG. 4A is prepared.

Figure 4B:
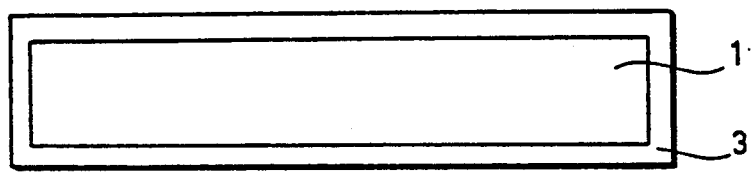

With reference to FIG. 4B, a P+ region 3 is formed over the entire surface area of the P type substrate 1 by diffusing P+ impurities of a concentration of, e.g., approximately $1 \times 10^{19} - 5 \times 10^{22} \text{cm}^{-3}$ into the P type silicon substrate 1.

Figure 4C:
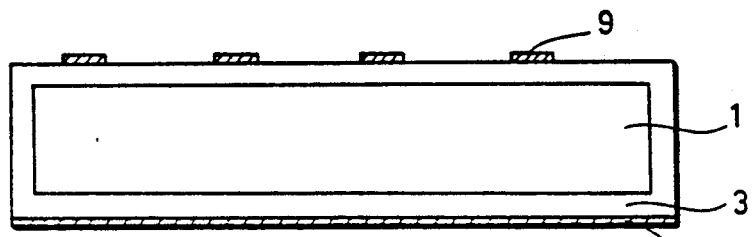

With reference to FIG. 4C, the entire lower surface and predetermined portions of the upper surface of the silicon substrate 1 are covered with an acid-resistant resin 9 such as a photoresist. Alternatively, an acid-resistant tape may be attached to the lower surface of the silicon substrate 1.

Figure 4D:
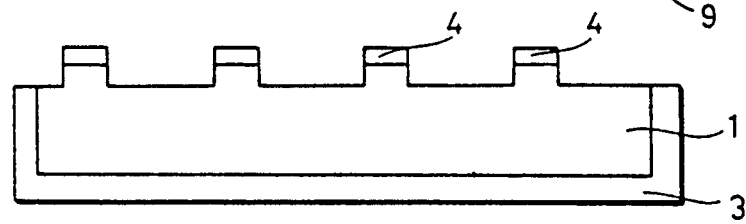

With reference to FIG. 4D, the silicon substrate 1 in the state of FIG. 4C is then etched by dipping into an etching solution consisting of hydrofluoric acid and nitric acid. After that, the acid-resistant resin 9 is removed.

Figure 4E:
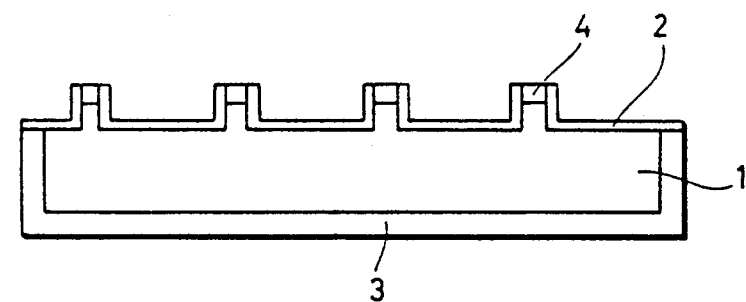

Then, as shown in FIG. 4E, an N type region 2 is formed on the upper surface of the silicon substrate 1 by thermal diffusion. At this time, the exposed surfaces of the P+ regions 4 are protected by a boron glass layer employed as a P type impurity source. However, careful attention must be paid to controlling the diffusion depth so as to prevent a high concentration of N type impurities from entering too deeply into each P+ region 4 from its opposite sides and thus damaging the P+ region 4.

Figure 4F:
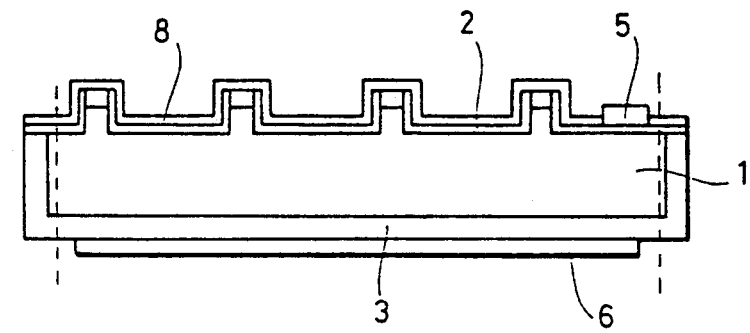

With reference to 4F, comb tooth-like from electrodes 7 (not shown) and an electrode connecting portion 5 are formed on the upper surface of the silicon substrate 1. Further, an anti-reflection film 8 and a back electrode 6 are formed, respectively, on the upper surface and the lower surface of the silicon substrate 1 by vacuum evaporation or the like. After that, cutting the resultant structure along the broken lines on the opposite sides of FIG. 4F results in the solar cell shown in FIG. 3.

Since the manufacturing method illustrated in FIGS. 4A-4F is not as complicated as the conventional manufacturing method shown in FIGS. 15A-15E, the manufacturing cost of the solar cell of FIG. 3 does not increase much.

The size of each of the island-like P+ regions 4 and the number of the P+ regions 4 need to be adjusted depending on the size and the type of each solar cell and each module. In general, in a solar cell having an area of 2 cm×2 cm, each P+ region 4 may be in the form of a circle with a diameter of 0.01-1.0 mm or of a quadrilateral with one side of 0.01-1.0 mm. In addition, the number of P+ regions 4 is preferably within the range of 10-100. If the total area of the island-like P+ regions 4 becomes too large, output characteristics of the solar cell deteriorate. It is thus desirable to design the solar cell so that the total area of the P+ region 4 is as small as possible while satisfying conditions by which a Zener breakdown takes place in the P+ regions 4 before the solar cell is damaged.

Figure 5:
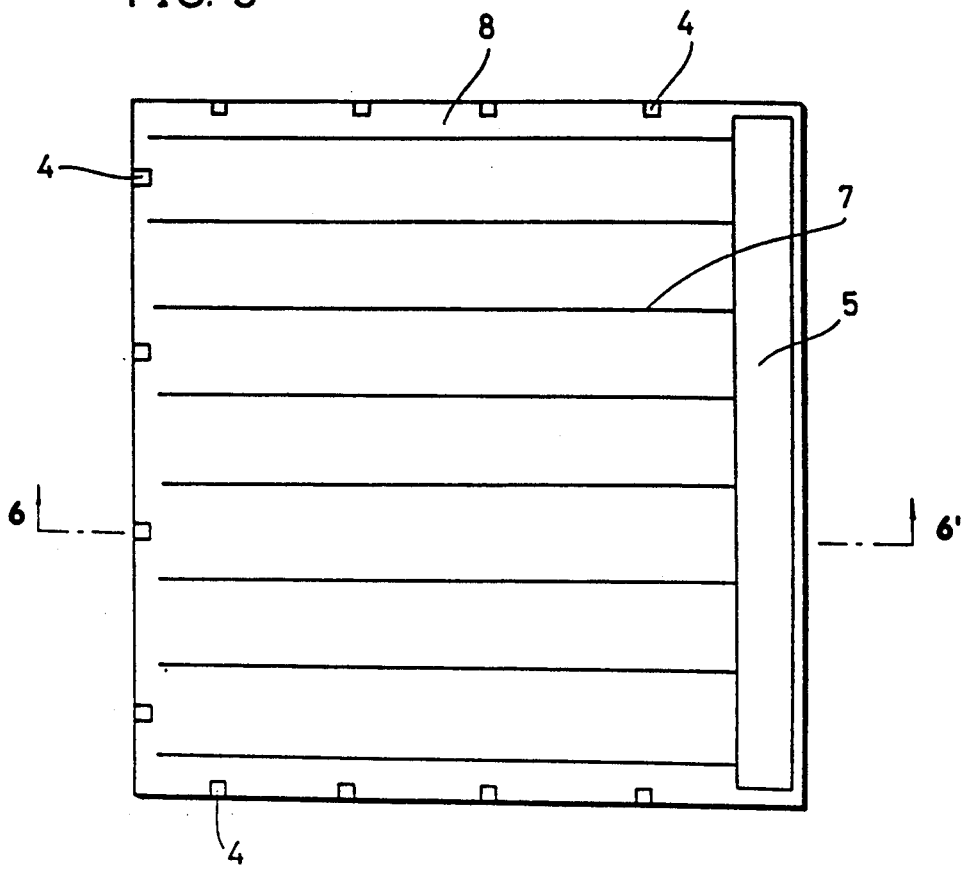
FIG. 5 is a top view of a solar cell according to another embodiodent of the present invention.
Figure 6:
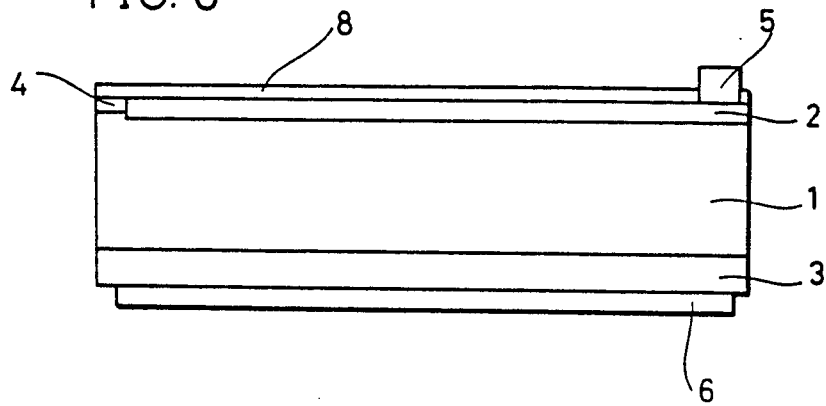
FIG. 6 is a cross-sectional view taken along the line 6—6' of FIG. 5.

FIG. 5 is a top plan view of a solar cell which belongs to the FIG. 1B type; and FIG. 6 is a cross-sectional view taken along the line 6—6' of FIG. 5. The solar cell shown in FIGS. 5 and 6 is also similar to the one shown in FIGS. 12 and 13. However, the solar cell shown in FIGS. 5 and 6 additionally includes a plurality of small P+ regions 4 formed locally along the periphery of the upper surface of the solar cell. The solar cell of FIG. 6 can be manufactured by, e.g., the following process.

Figure 7A:
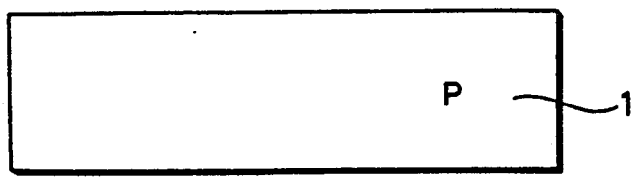
FIGS. 7A-7E are cross-sectional views showing steps of manufacturing the solar cell of FIG. 6.
Figure 7B:
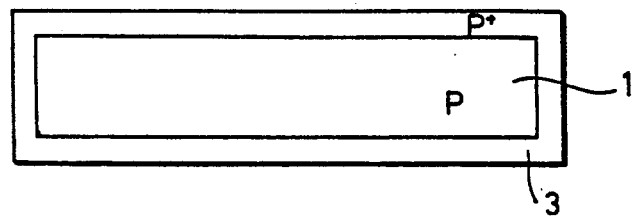

First, a P type silicon substrate 1 is prepared as shown in FIG. 7A.

With reference to 7B, a P+ region 3 is formed on the entire surface of the P type substrate 1 by diffusing P type impurities of a concentration of, e.g., approximately $1 \times 10^{19}$ to $5 \times 10^{22}$ cm$^{-3}$ into the P type silicon substrate 1.

Figure 7C:
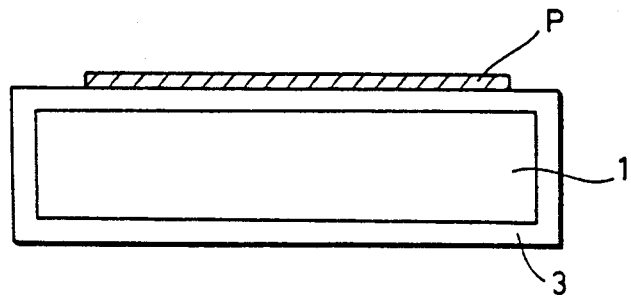

Referring to FIG. 7C, a paste P including N type impurities at a high concentration is applied onto a predetermined region on the upper surface of the silicon substrate 1. A silicon oxide film or a nitride film doped with N type impurities of a high concentration may be deposited by a CVD (Chemical Vapor Deposition) method in place of the paste P.

Figure 7D:
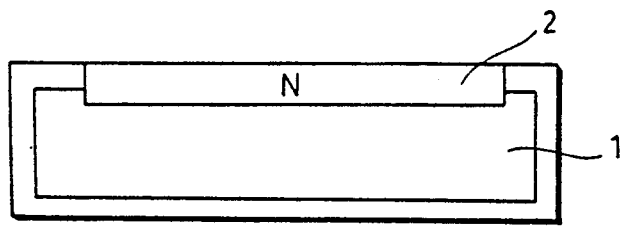

With reference to FIGS. 7C and 7D, the paste P is baked and an N type region 2 is formed.

Figure 7E:
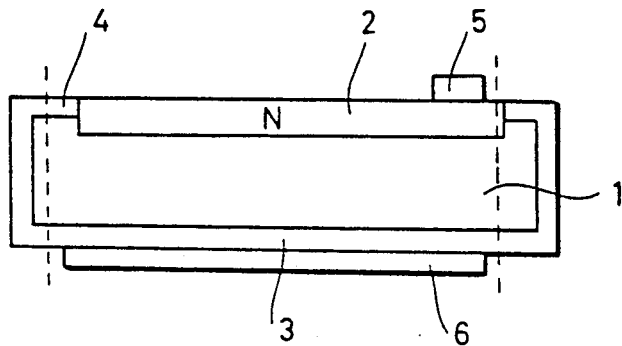

As shown in FIG. 7E, comb tooth-like from electrodes 7 (not shown) and an electrode connecting portion 5 are then formed on the upper surface of the silicon substrate 1, and an anti-reflection film 8 (not shown) is formed thereon by vacuum evaporation or the like. A back electrode 6 is formed on the lower surface of the silicon substrate 1 by vacuum evaporation or the like. Finally, cutting the resultant structure along the broken lines on the opposite sides of FIG. 7E results in the solar cell shown in FIG. 6.

Since the manufacturing method illustrated in FIGS. 7A-7E is also not as complicated as the conventional manufacturing method shown in FIGS. 15A-15E, the manufacturing cost of the solar cell of FIG. 6 does not increase much.

Figure 8:
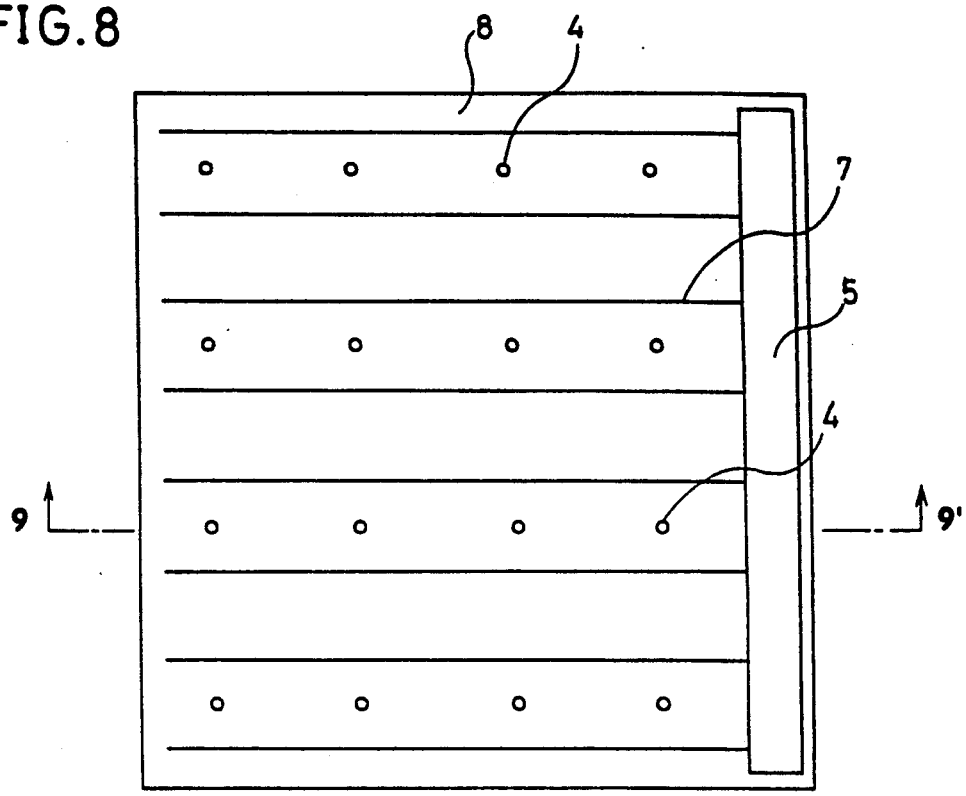
FIG. 8 is a top view of a solar cell according to still another embodiodent of the present invention.
Figure 9:
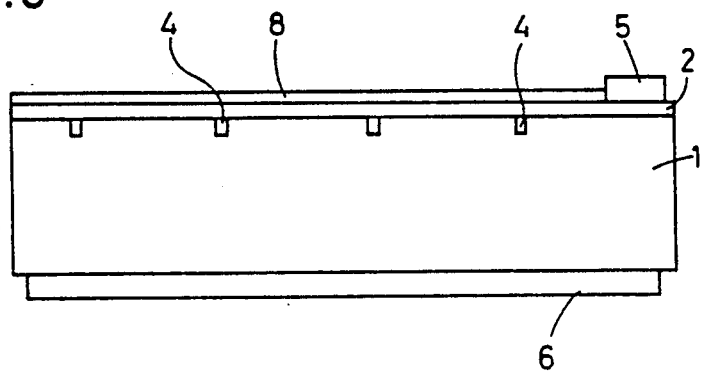
FIG. 9 is a cross-sectional view taken along the line 9—9' of FIG. 8.

FIG. 8 is a top view of a solar cell which belongs to the FIG. 1C type; and FIG. 9 is a cross-sectional view taken along the lines 9—9' of FIG. 8. The solar cell shown in FIGS. 8 and 9 is similar to the one shown in FIGS. 2 and 3; however, the island-like P+ regions 4 shown in FIGS. 8 and 9 are different in shape from those shown in FIGS. 2 and 3. The solar cell of FIG. 9 can be manufactured by, e.g., the following process.

Figure 10A:
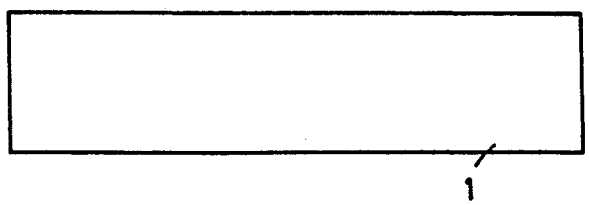
FIGS. 10A-10F are cross-sectional views showing steps of manufacturing the solar cell of FIG. 9.

First, a P type silicon substrate 1 shown in FIG. 10A is prepared.

Figure 10B:
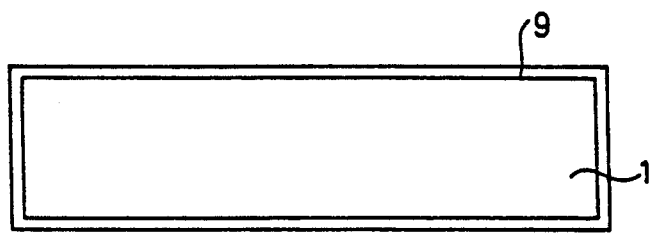

With reference to FIG. 10B, an oxide film 9 is formed on the entire surface of the silicon substrate 1 by thermal oxidation or the like.

Figure 10C:
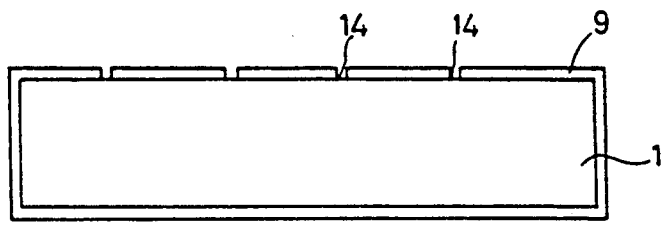

Referring now to FIG. 10C, a plurality of openings 14 are formed in predetermined positions in the oxide film 9 on the upper surface of the silicon substrate 1.

Figure 10D:
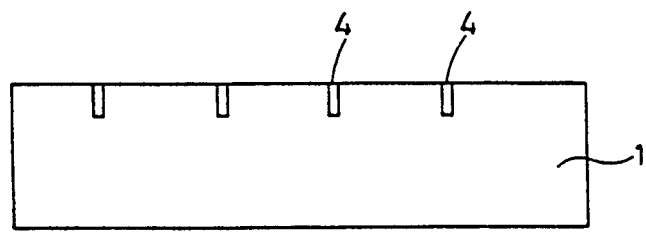

As shown in FIGS. 10C and 10D, boron is diffused to an extent or approximately $1 \times 10^{20}$ cm$^{-3}$ through the openings 14 in the oxide film, thereby forming a plurality of island-like P+ regions 4. Here, the island-like P+ regions 4 should be formed deeper than the N type region 2 which is formed in the next step. After that, the entire oxide film 9 is removed.

Figure 10E:
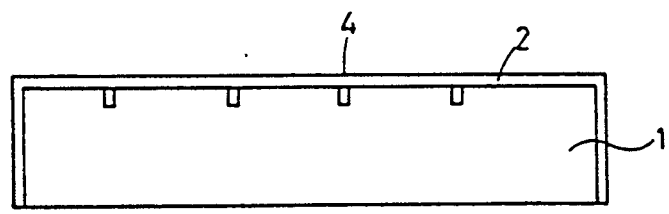

With reference to FIG. 10E, the N type region 2 is formed on the surface of the silicon substrate 1 by thermal diffusion or the like. As a result of this step, the P+ region 4 are buried under the N type region 2. After that, at least the upper surface of the silicon substrate is coated with an acid-resistant resin such as a photoresist, and thereafter, the N type region 2 on the lower surface of the silicon substrate 1 is etched away with a mixed solution of hydrofluoric acid and nitric acid.

Figure 10F:
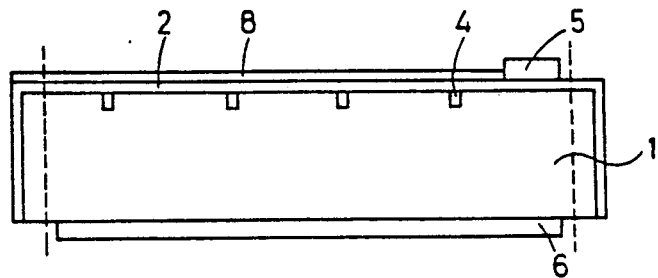
Figure 11:
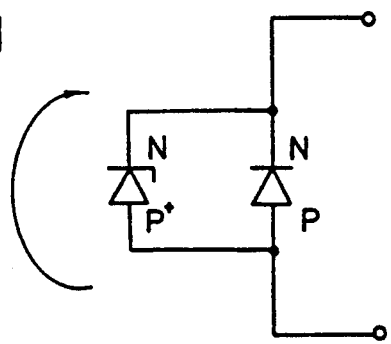
FIG. 11 is a diagram of an equivalent circuit of a solar cell of the present invention.

With reference to FIG. 10F, comb tooth-like front electrodes 7 (not shown) and an electrode connecting portion 5 are formed on the upper surface of the silicon substrate 1, and an anti-reflection film 8 is formed thereon by vacuum evaporation or the like. A back electrode 6 is formed on the lower surface of the silicon substrate 1 by vacuum evaporation or the like. Finally, cutting of the resultant structures along the broken lines on the opposite sides of FIG. 10F results in the solar cell shown in FIG. 9.

Since the manufacturing method illustrated in FIGS. 10A-10F is also not as complicated as the conventional manufacturing method shown in FIGS. 15A-15E, the manufacturing cost of the solar cell of FIG. 9 does not increase much.

In the step of FIG. 10C, a photoresist may be employed in place of the oxide film 9 formed thermally and then the P+ regions 4 may be formed by employing ion implantation in place of thermal diffusion.

In the solar cell of the FIG. 1C type, it is not possible for the P+ regions 4 to come into contact with the front electrodes 7. Therefore, the P+ regions 4 can be formed below the from electrodes 7 in the solar cell of the type of FIG. 1C.

While no description has been given with respect to solar batteries of a BSF type and a BSFR (BSF and back surface reflector) type in the foregoing embodiodents, it will be understood that the present invention is applicable to both the BSF type and the BSFR types of solar batteries.

Further, while description has been given of the use of a P type silicon substrate in the foregoing embodiodents, it will be understood that an N type silicon substrate and substrates other than a silicon single crystal substrate, such as a GaAs substrate, may also be employed in the present invention.

It will also be understood that the present invention is applicable to solar cells for space use and for terrestrial use.

As described above, according to the present invention, it is possible to provide a solar cell at a low cost in which short-circuit damage due to a reverse bias voltage is less liable to occur. In particular, in the case with a space solar cell module which is difficult to maintain, the present invention can exert a prominent effect on protection of the solar cell against a reverse bias voltage and enhance reliability of the entire solar cell module. Moreover, since the solar cell in accordance with the present invention does not require any bypass diode, the cost of the solar cell is further reduced.

Although the present invention has been described and illustrated in detail, it is clearly understood that the same is by way of illustration and example only and is not to be taken by way of limitation, the spirit and scope of the invention being limited only by the terms of the appended claims.

What is claimed is:

1. A solar cell, comprising:
   a first semiconductor region of a first conductivity type;
   a second semiconductor region of a second conductivity type in contact with said first semiconductor region so as to form a PN junction therebetween;
   a third semiconductor region of the first conductivity type in contact with both said first and second semiconductor regions to form a bypass diode, said third semiconductor region having an impurity concentration higher than the impurity concentration of said first semiconductor region; and
   an electrode comprising a plurality of spaced apart elements formed on a surface of said second semiconductor region,
   wherein said third semiconductor region includes a plurality of island-like regions formed in said second semiconductor region each of said plurality of island-like regions being formed in the spaces between said spaced apart elements of said electrode without contacting said electrode.

2. The solar cell of claim 1, wherein said solar cell is selected from the group consisting of a BSF type and a BSFR type solar cell.

3. The solar cell of claim 1, wherein said semiconductor is selected from the group consisting of silicon and GaAs.

4. The solar cell of claim 1, wherein said first conductivity type is P type and said second conductivity type is N type.

5. The solar cell of claim 1, wherein said island-like regions are of circular cross section each having a diameter of 0.01 mm to 1.0 mm.

6. The solar cell of claim 1, wherein said island-like regions are of quadrilateral cross section with one side having a length of 0.01 mm to 1.0 mm.

7. A solar cell, comprising:
   a first semiconductor region of a first conductivity type;
   a second semiconductor region of a second conductivity type in contact with said first semiconductor region so as to form a PN junction therebetween;
   a third semiconductor region of the first conductivity type in contact with both said first and second semiconductor regions to form a bypass diode, said third semiconductor region having an impurity concentration higher than the impurity concentration of said first semiconductor region; and
   an electrode comprising a plurality of spaced apart elements formed on a surface of said second semiconductor region,
   wherein said third semiconductor region comprises a plurality of island-like regions formed along a major portion of the periphery of said second semiconductor region and is formed without contacting said electrode.

8. The solar cell of claim 7 wherein said solar cell is selected from the group consisting of a BSF and BSFR type solar cell.

9. The solar cell of claim 7 wherein said semiconductor is selected from the group consisting of silicon and GaAs.

10. The solar cell of claim 7 wherein said first conductivity type is P type and said second conductivity type is N type.

11. The solar cell of claim 7 wherein said plurality of regions are of quadrilateral cross section with one side having a length of 0.01 mm to 1.0 mm.

12. A solar cell, comprising:
    a first semiconductor region of a first conductivity type;
    a second semiconductor region of a second conductivity type in contact with said first semiconductor region so as to form a PN junction therebetween;
    a third semiconductor region of the first conductivity type in contact with both said first and second semiconductor regions to form a bypass diode, said third semiconductor region having an impurity concentration higher than the impurity concentration of said first semiconductor region; and
    electrodes formed on a surface of said second semiconductor region,
    wherein said third semiconductor region is formed as a plurality of well-like regions extending from said PN junction into said first semiconductor region and is formed without contacting said electrodes.

13. The solar cell of claim 12 wherein said solar cell is selected from the group consisting of a BSF and BSFR type solar cell.

14. The solar cell of claim 12 wherein said semiconductor is selected from the group consisting of silicon and GaAs.

15. The solar cell of claim 12 wherein said first conductivity type is P type and said second conductivity type is N type.

16. The solar cell of claim 12 wherein said well-like regions are of circular cross section each having a diameter of 0.01 mm to 1.0 mm.

17. The solar cell of claim 12 wherein said well-like regions are quadrilateral cross section with one side having a length of 0.01 mm to 1.0 mm.

* * * * *